Feb. 23, 1971 M. C. STEVENS 3,566,298
AMPLIFIER CIRCUIT PROVIDING A FLOATING OUTPUT
Filed March 12, 1969
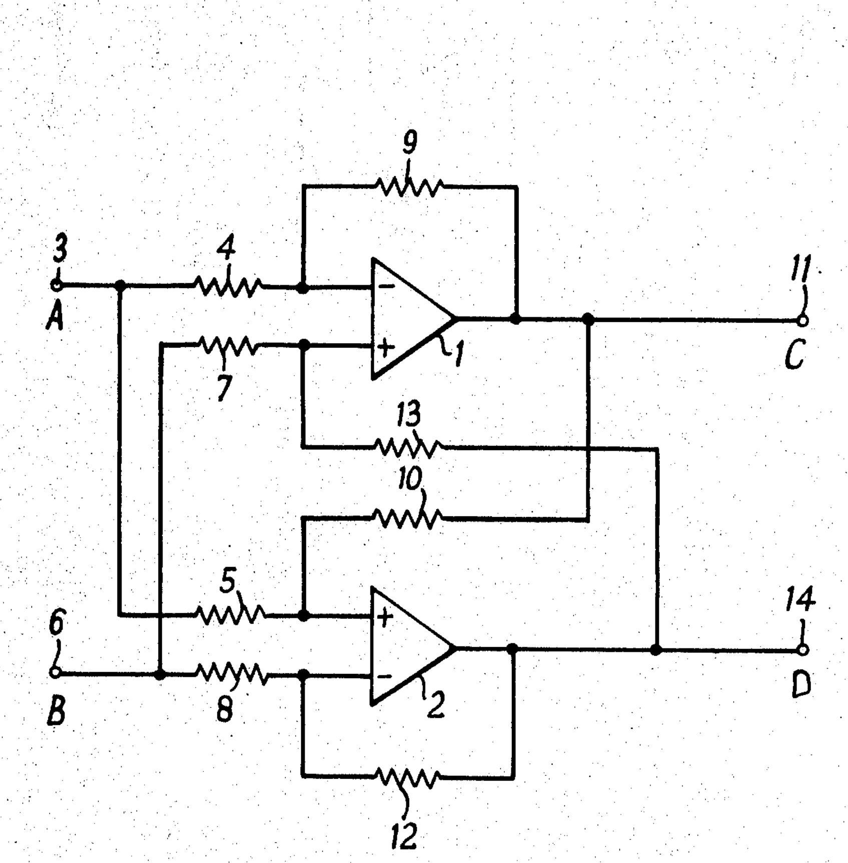

United States Patent Office 3,566,298

Patented Feb. 23, 1971

3,566,298

AMPLIFIER CIRCUIT PROVIDING A FLOATING OUTPUT

Michael Charles Stevens, Broxbourne, England, assignor to A. C. Cossor Limited, Harlow, England Filed Mar. 12, 1969, Ser. No. 806,607

Claims priority, application Great Britain, Apr. 10, 1968, 17,175/68

Int. Cl. H03f 3/68

U.S. Cl. 330—84 1 Claim

ABSTRACT OF THE DISCLOSURE

As an alternative to a transformer as a means for providing a floating output the invention uses two cross-coupled differential amplifiers in a novel circuit configuration. The circuit is much less bulky than a transformer and can be micro-miniaturized.

This invention relates to an electrical circuit which will provide a floating output, i.e. an output which is not referenced to a supply or ground potential but which can, within limits, be referenced to any required potential established by a further circuit to which the output is supplied. This facility is a fairly common requirement in electrical equipment and is usually provided by means of an isolating transformer, which must be preceded by a chopper and followed by a synchronous rectifier in the case of D.C. signals.

A transformer is necessarily a relatively bulky component, unsuited for incorporation in an integrated circuit. The object of this invention is to provide a circuit which lends itself to microminiaturisation and which can be provided wholly as an integrated circuit, although the invention is not limited to realization in this form.

The circuit according to the invention comprises two differential amplifiers and two input terminals, each amplifier having its two inputs connected to the two terminals respectively and its output connected to one of its own inputs and one input of the other amplifier in an arrangement such that the differential output of the two amplifiers equals the differential input between the two terminals. It will be shown that the differential output thus provided is a floating output.

The invention will be described in more detail, by way of example, with reference to the accompanying drawing, in which the sole figure is a block diagram of two differential amplifiers 1 and 2 and their connections. The two inputs of each amplifier are denoted + and —, the output varying in the same sense as the + input and in the opposite sense to the —input.

A first input terminal 3 is connected to the — input of amplifier 1 and the + input of amplifier 2 through resistors 4 and 5 respectively. A second input terminal 6 is connected to the + input of amplifier 1 and the — input of amplifier 2 through resistors 7 and 8 respectively. The output of the amplifier 1 is connected to its own — input through a resistor 9, to the + input of the amplifier 2 through a resistor 10 and to a first output terminal 11. The output of the amplifier 2 is connected to its own — input through a resistor 12, to the + input of the amplifier 1 through a resistor 13 and to a second output terminal 14.

All eight of the abovementioned resistors are equal, providing unity gain for the amplifiers. It follows, if the potentials on terminals 3, 6, 11 and 14 are denoted A, B, C and D respectively, that for the amplifier 1:

$$C=B-A+D$$

and, for the amplifier 2:

$$D=A-B+C$$

It can be seen immediately that the differential output $C-D$ is equal to the differential input $B-A$. What is more the form of the equations is such that either C or D can be assigned an arbitrary value without upsetting the relationships.

Therefore, irrespective of the level to which A or B may be tied, either output terminal may be shorted to ground or taken to any voltage level within the output range of the differential amplifiers without damage and without disturbing the differential output relationship $C-D=B-A$.

I claim:

1. An electrical circuit for providing a floating output, comprising first and second differential amplifiers each having first and second inputs and an output, a first input terminal coupled to the first input of the first differential amplifier and to the second input of the second differential amplifiers, a second input terminal coupled to the second input of the first differential amplifier and to the first input of the second differential amplifier, first and second output terminals respectively coupled to the outputs of the first and second differential amplifiers, means coupling the output of the first differential amplifier to the first input of the first differential amplifier and to the second input of the second differential amplifier and means coupling the output of the second differential amplifier to the second input of the first differential amplifier and to the first input of the second differential amplifier.

References Cited

UNITED STATES PATENTS 3,223,940 12/1965 Early et al. ............ 330—84

ROY LAKE, Primary Examiner

J. B. MULLINS, Assistant Examiner

U.S. Cl. X.R.

330—69, 124